United States Patent
Ma et al.

(10) Patent No.: US 6,833,629 B2
(45) Date of Patent: Dec. 21, 2004

(54) DUAL CURE B-STAGEABLE UNDERFILL FOR WAFER LEVEL

(75) Inventors: Bodan Ma, Hillsborough, NJ (US); Sun Hee Hong, Hillsborough, NJ (US); Quinn K. Tong, Belle Mead, NJ (US)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 0 days.

(21) Appl. No.: 10/020,638

(22) Filed: Dec. 14, 2001

(65) Prior Publication Data

US 2003/0141592 A1 Jul. 31, 2003

(51) Int. Cl.$^7$ .......................... H01L 23/28; H01L 23/29
(52) U.S. Cl. ................... 257/790; 257/787; 257/788; 257/789; 257/793
(58) Field of Search .................. 257/787–790, 257/793, 743, 778, 795; 438/108, 118

(56) References Cited

U.S. PATENT DOCUMENTS

| | | |
|---|---|---|
| 3,746,686 A | 7/1973 | Marshall et al. |
| 3,985,928 A | 10/1976 | Watanabe et al. |
| 4,401,499 A * | 8/1983 | Kaneko et al. ........... 156/307.3 |
| 4,816,531 A | 3/1989 | Young |
| 5,081,167 A | 1/1992 | Jackson |
| 5,082,880 A * | 1/1992 | Kitahara et al. ............. 523/466 |
| 5,128,746 A * | 7/1992 | Pennisi et al. .............. 257/738 |
| 5,266,662 A | 11/1993 | Jakob et al. |
| 5,494,981 A * | 2/1996 | Gorodisher et al. ......... 525/504 |
| 5,510,633 A | 4/1996 | Orlowski et al. |
| 5,579,573 A * | 12/1996 | Baker et al. ................... 29/840 |
| 5,654,081 A * | 8/1997 | Todd .......................... 428/209 |
| 5,728,633 A * | 3/1998 | Jacobs ......................... 442/148 |
| 5,800,874 A * | 9/1998 | Appelt et al. ................ 427/412 |
| 6,057,381 A | 5/2000 | Ma et al. |

(List continued on next page.)

FOREIGN PATENT DOCUMENTS

| | | |
|---|---|---|
| EP | 0123262 A | 4/1984 |
| EP | 0 123 262 | 10/1984 |
| EP | 0 553 557 | 8/1993 |
| EP | 0 969 061 | 1/2000 |
| JP | 5565217 A | 5/1980 |
| JP | 5718815 | 1/1982 |
| JP | 61237436 | 10/1986 |
| JP | 62275123 | 11/1987 |
| JP | 62-275123 | * 11/1987 |
| JP | 11343465 | 12/1999 |
| JP | 200225211 | * 7/2001 |
| JP | 2001220556 | 8/2001 |
| JP | 2001220571 A | 8/2001 |
| KR | 2001054743 | 7/2001 |
| WO | WO 99/05196 | 2/1999 |
| WO | WO 99/67324 | 12/1999 |
| WO | WO 00/34032 | 6/2000 |
| WO | WO 00/52751 | 8/2000 |
| WO | WO 00/52751 | 9/2000 |

OTHER PUBLICATIONS

L. Nguyen, "Solder Joint Shape Formation Under Constrained Boundaries in Wafer Level Underfill", 2000 IEEE.*

Nguyen L., et al.: "Solder Joint Shape Formation Under Constrained Boundaries in Wafer Level Underfill"; 2000 Electronic Components and Technology Conference; pgs. 1320–1325.

*Primary Examiner*—Kamand Cuneo
*Assistant Examiner*—James M. Mitchell
(74) *Attorney, Agent, or Firm*—Jane E. Cennaro

(57) ABSTRACT

A silicon wafer has a B-stageable underfill material deposited on the active face of the wafer. The B-stageable underfill comprises a first composition with a lower curing temperature and a second composition with a higher curing temperature, characterized in that the first composition has been fully cured.

2 Claims, 1 Drawing Sheet

U.S. PATENT DOCUMENTS

| | | | |
|---|---|---|---|
| 6,063,649 A | | 5/2000 | Yoshino |
| 6,063,828 A | | 5/2000 | Ma et al. |
| 6,107,451 A | * | 8/2000 | Fischer et al. .............. 528/335 |
| 6,187,416 B1 | | 2/2001 | Satoh et al. |
| 6,194,490 B1 | | 2/2001 | Roth et al. |
| 6,228,678 B1 | | 5/2001 | Gilleo et al. |
| 6,307,001 B1 | | 10/2001 | Musa |
| 6,331,446 B1 | * | 12/2001 | Cook et al. ................ 438/106 |
| 6,388,321 B1 | * | 5/2002 | Hirai et al. ................ 174/259 |
| 6,441,213 B1 | | 8/2002 | Musa et al. |
| 2001/0000929 A1 | | 5/2001 | Gilleo |
| 2001/0020071 A1 | | 9/2001 | Capote et al. |
| 2002/0013420 A1 | * | 1/2002 | Wang et al. ................ 525/406 |
| 2002/0084019 A1 | * | 7/2002 | Date et al. .................. 156/206 |
| 2002/0128428 A1 | * | 9/2002 | Gan et al. ................... 528/288 |
| 2002/0185222 A1 | * | 12/2002 | Wigdorski et al. .......... 156/330 |
| 2003/0141592 A1 | | 7/2003 | Ma et al. |

* cited by examiner

US 6,833,629 B2

DUAL CURE B-STAGEABLE UNDERFILL FOR WAFER LEVEL

FIELD OF THE INVENTION

This invention relates to B-stageable underfill compositions suitable for application to a silicon wafer before singulation. The compositions contain two separately curing chemistries.

BACKGROUND OF THE INVENTION

Microelectronic devices contain millions of electrical circuit components that are electrically connected to each other and electrically connected to and mechanically supported on a carrier or a substrate. The connections are made between electrical terminations on the electronic component and corresponding electrical terminations on the substrate.

One method for making these interconnections uses polymeric or metallic material that is applied in bumps to the component or substrate terminals. The terminals are aligned and contacted together and the resulting assembly is heated to reflow the metallic or polymeric material and solidify the connection.

During its normal service life, the electronic assembly is subjected to cycles of elevated and lowered temperatures. Due to the differences in the coefficient of thermal expansion for the electronic component, the interconnect material, and the substrate, this thermal cycling can stress the components of the assembly and cause it to fail. To prevent failure, the gap between the component and the substrate is filled with a polymeric encapsulant, hereinafter called underfill or underfill encapsulant, to reinforce the interconnect material and to absorb some of the stress of the thermal cycling.

Two prominent uses for underfill technology are for reinforcing packages known in the industry as chip scale packages (CSP), in which a chip package is attached to a substrate and flip-chip packages in which a chip is attached by an array of interconnections to a substrate.

In conventional underfill applications, the underfill dispensing and curing take place after the reflow of the metallic or polymeric interconnect. If the interconnect is a metal solder composition, a fluxing agent initially is applied on the metal terminal pads on the substrate. The semiconductor chip is placed on the fluxed area of the soldering site. The assembly is then heated to allow for reflow of the solder joint, or reflow of the polymeric interconnect. Next, a measured amount of underfill is dispensed along one or more peripheral sides of the electronic assembly and capillary action within the component-to-substrate gap draws the material inward. After the gap is filled, additional underfill encapsulant may be dispensed along the complete assembly periphery to help reduce stress concentrations and prolong the fatigue life of the assembled structure. The underfill encapsulant is subsequently cured to reach its optimized final properties.

In another conventional method, the underfill is dispensed onto the substrate. A bumped chip is placed active-face down on the underfill and the assembly heated to establish the solder or polymeric interconnections and cure the underfill.

Recently, attempts have been made to streamline the process and increase efficiency by placing the underfill encapsulant directly onto the semiconductor wafer before it is diced into individual chips. This procedure, which can be performed via various methods, including screen printing, stencil printing and spin coating, allows for a single application of underfill to a semiconductor wafer, which is later diced into multiple individual chips.

In order to be useful as a wafer level underfill encapsulant, the underfill must have several properties. The material must be easy to apply uniformly on the wafer so that the entire wafer has a consistent coating. During the final attachment of the individual chips to a substrate, the underfill must flow to enable fillet formation, flux the solder bumps if solder was used and provide good adhesion. Whether the interconnection of the chip to the substrate is made with solder or with polymeric material, curing of the underill should occur after the interconnection is formed and should occur rapidly.

Another important property is that the underfill must be able to be solidified after application to the wafer so as not to interfere with the clean dicing of the wafer into individual chips. The solidification of the underfill encapsulant is done by a process called B-staging, which means that the underfill material undergoes an initial heating after its placement on the wafer to result in a smooth, non-tacky coating without residual solvent.

If the starting underfill material is a solid, the solid is dispersed or dissolved in a solvent to form a paste and the paste applied to the wafer. The underfill is then heated to evaporate the solvent, leaving a solid, but uncured, underfill on the wafer. If the starting underfill material is a liquid or paste, the underfill is dispensed onto the wafer and heated to partially cure it to a solid state.

The B-stage heating typically occurs at a temperature lower than 150° C., preferably within the range of about 100° C. to about 150° C. The final curing of the underfill encapsulant must be delayed until after solder fluxing (when solder is the interconnect material) and the forming of the interconnection, which occurs at a temperature of 183° C. in the case of tin-lead eutectic solder.

SUMMARY OF THE INVENTION

This invention is an underfill composition comprising two chemical compositions have curing temperatures or curing temperature ranges sufficiently separated to allow the composition with the lower curing temperature, hereinafter the first composition, to cure without curing the composition with the higher curing temperature, hereinafter the second composition. In practice, the first composition will be cured during a B-staging process, and the second composition will be left uncured until a final cure is desired, such as, at the final attach of a semiconductor chip to a substrate. The fully cured material is cross-linked or polymerized to a sufficiently high molecular weight effective to give it structural integrity.

DETAILED DESCRIPTION OF THE INVENTION

Figure 1:
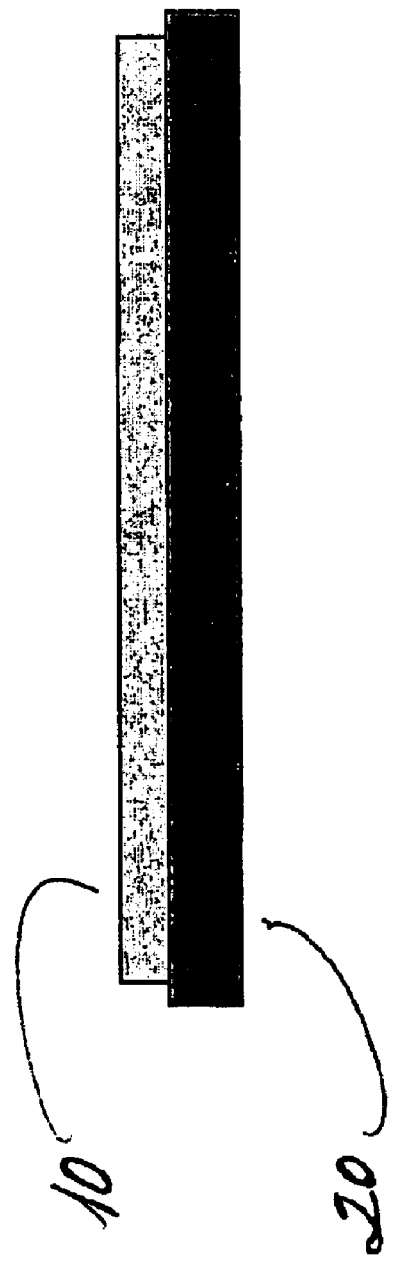
FIG. 1 depicts a silicon wafer (20) having a layer of underfill (10) deposited on one face.

Each of the first and second composition is one or more monomeric, one or more oligomeric, or one or more polymeric compounds or resins, or combinations of those, that co-react to polymerize or cross-link. Both polymerization and cross-linking are referred to as curing. The compositions in general will contain a curing agent or curing initiator in addition to the monomeric, oligomeric, or polymeric species, and optionally, may contain a solvent. Within this specification and claims, the combination of the first and second compositions will be referred to as the total B-stageable underfill.

The first composition will comprise a liquid, or a solid dissolved or dispersed in a solvent. The second composition will be a solid or semi-solid material at room temperature, dispersible or dissolvable either in the liquid first composition, or in the same or a compatible solvent for the first composition. The choice of first and second compositions will be determined in part by the temperature at which the final interconnection of the semiconductor chip to its substrate is made.

For example, in the case of tin-lead eutectic solder, the solder fluxing and interconnection occurs at a temperature of 183° C. The final curing of the underfill should occur rapidly after the solder bump flow and interconnection and may occur at the solder reflow temperature or at a higher temperature. Consequently, in this case, the second composition will be chosen to have a curing temperature near or at 183° C. or slightly higher. If a polymeric interconnect material is used, the second composition will be chosen to have a curing temperature at or near the curing temperature of the polymeric interconnnect.

The first composition is chosen so that it will cure before the curing temperature of the second composition and before the temperature at which the interconnect is made. The curing temperatures of the first and second compositions can be separated by any amount effective to provide two distinct curing profiles such that the second composition does not cure at or within the curing temperature range of the first composition, although insignificant curing of the second composition during the B-stage process is tolerable. In a preferred embodiment, the curing temperatures of the first and second compositions will be separated by at least 30° C.

Typically, the B-stage heating, that is, the first composition curing, occurs at a temperature within the range of about 100° C. to about 150° C. Any solvent used should be chosen to evaporate off within the same temperature range as first composition curing. Curing the first composition and evaporating the solvent during the B-stage process will solidify the total underfill composition, permit clean dicing of the wafer, and inhibit voiding during the final attachment process.

When heated to the appropriate attach temperature for the semiconductor die, the total underfill composition should melt and flow sufficiently to completely wet-out the surface of the substrate. An efficient wet-out results in good adhesion.

The curing processes can be initiated and advanced by irradiation (such as with UV light) for the B-staging first cure, and then by heat for the final cure, or both the B-staging and final cure can be initiated and advanced by heat.

The first and second compositions will be present in a molar ratio of 5:95 to 95:5, as can be determined by the practitioner for specific end uses. Combinations of first compositions and second compositions of the total B-stageable underfill include:

First: thermally curable acrylic (such as those available from Sartomer), maleimide (such as those available from Ciba Specialty Chemicals or National Starch and Chemical Company), and vinyl compounds (such as vinyl ethers and vinyl silanes available from Aldrich) with free radical curing agents. Second: thermally curable epoxy compounds or resins (such as those available from National Starch, CIBA, Sumitomo or Dainippon) with latent amine or imidazole curing agents.

First: thermally curable acrylic compounds (such as those available from Sartomer) with free radical curing agents. Second: thermally curable epoxy compounds or resins (such as those available from National Starch, CIBA, Sumitomo or Dainippon) with latent amine or imidazole curing agents.

First: radiation curable cycloaliphatic epoxy compounds (such as CIBA CY179) with photoinitiators. Second: thermally curable aromatic epoxy compounds (such as bisphenol A diepoxide) with phenolic hardeners and phosphine-based curing agents.

First: radiation curable acrylic compounds (such as those available from Sartomer) with photoinitiators. Second: thermally curable epoxy compounds (such as those available from National Starch, CIBA, Sumitomo or Dainippon) with latent amine or imidazole curing agents.

First: thermally initiated, free radical curable bismaleimide compounds (electron acceptors) (such as those available from Ciba Specialty Chemicals or National Starch and Chemical Company) with (electron donors) vinyl ethers, vinyl silanes, styrenic compounds, cinnamyl compounds. Second: thermally curable epoxy compounds (such as those available from National Starch, CIBA, Sumitomo or Dainippon) with latent amine or imidazole curing agents.

Examples of suitable epoxy resins include monofunctional and multifunctional glycidyl ethers of Bisphenol-A and Bisphenol-F, aliphatic and aromatic epoxies, saturated and unsaturated epoxies, cycloaliphatic epoxy resins and combinations of those.

Preferred epoxy resins are glycidyl ether epoxies, either separately or in combination with non-glycidyl ether epoxies. A preferred epoxy resin of this type is bisphenol A epoxy resin. Bisphenol-A type resin is commercially available from Resolution Technology as EPON 828. Another preferred epoxy resin is bisphenol F epoxy resin, prepared by the reaction of one mole of bisphenol F resin and two moles of epichlorohydrin. Bisphenol-F type resins are available commercially from CVC Specialty Chemicals, Maple Shade, N.J., under the designation 8230E, and from Resolution Performance Products LLC under the designation RSL1739. A blend of bisphenol-A and bisphenol-F is available from Nippon Chemical Company under the designation ZX-1059.

Another suitable epoxy resin is epoxy novolac resin, which is prepared by the reaction of phenolic resin and epichlorohydrin. A preferred epoxy novolac resin is poly (phenyl glycidyl ether)-co-formaldehyde.

Other suitable epoxy resins are biphenyl epoxy resin, commonly prepared by the reaction of biphenyl resin and epichlorohydrin; dicyclopentadiene-phenol epoxy resin; naphthalene resins; epoxy functional butadiene acrylonitrile copolymers; epoxy functional polydimethyl siloxane; and mixtures of the above.

Non-glycidyl ether epoxides may also be used. Suitable examples include 3,4-epoxycyclohexylmethyl-3,4-epoxycyclohexane carboxylate, which contains two epoxide groups that are part of the ring structures and an ester linkage; vinylcyclohexene dioxide, which contains two epoxide groups and one of which is part of the ring structure; 3,4-epoxy-6-methyl cyclohexyl methyl-3,4-epoxycyclohexane carboxylate; and dicyclopentadiene dioxide.

Further examples of suitable epoxies include:

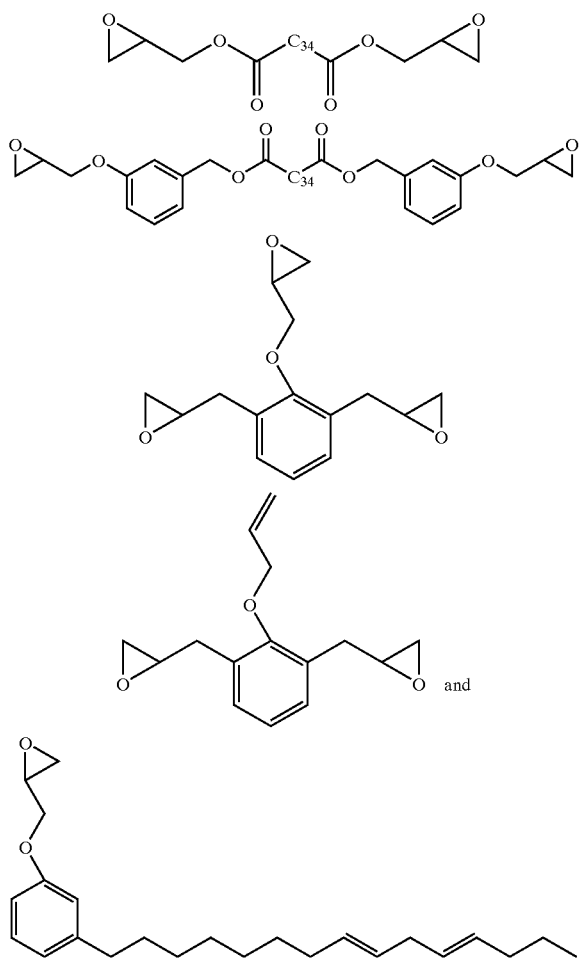

A preferred catalyst for the epoxy compositions used in the total B-stageable underfill is an imidazole-anhydride adduct. If the curing agent acts too quickly, it can gel the formulation and inhibit the fluxing of the solder. The use of the imidazole-anhydride adduct keeps the formulation viscosity at a sufficiently low level, usually below 5,000 mPa.s at 190° C., to ensure that fluxing can occur.

Preferred imidazoles for forming the adduct include non-N-substituted imidazoles, such as, 2-phenyl-4-methyl imidazole, 2-phenyl imidazole, and imidazole. Other useful imidazole components for the adduct include alkyl-substituted imidazoles, N-substituted imidazoles, and mixtures of those.

Preferred anhydrides for forming the adduct are cycloaliphatic anhydrides, such as, pyromellitic dianhydride, commercially available as PMDA from Aldrich. Other suitable anhydrides include methylhexa-hydro phthalic anhydride (commercially available as MHHPA from Lonza Inc. Intermediates and Actives) methyltetra-hydrophthalic anhydride, nadic methyl anhydride, hexa-hydro phthalic anhydride, tetra-hydro phthalic anhydride, phthalic anhydride, dodecyl succinic anhydride, bisphenyl dianhydride, benzophenone tetracarboxylic dianhydride, and mixtures of those.

Two preferred adducts are a complex of 1 part 1,2,4,5-benzenetetracarboxylic anhydride and 4 parts 2-phenyl-4-methylimidazole, and a complex of 1 part 1,2,4,5-benzenetetracarboxylic dianhydride and 2 parts 2-phenyl4-methylimidazole. The adducts are prepared by dissolving the components in a suitable solvent, such as acetone, under heat. Upon cooling the adduct precipitates out.

In addition to the first and second compositions and curing agents, the total B-stageable underfill optionally further may comprise a solvent, an inorganic filler, and a fluxing agent. Other optional components that may be used at the formulator's discretion include one or more air release agents, flow additives, adhesion promoters, rheology modifiers, and surfactants. The components are specifically chosen to obtain the desired balance of properties for the use of the chemistry sets chosen.

Examples of suitable cinnamyl donors for use with maleimides include:

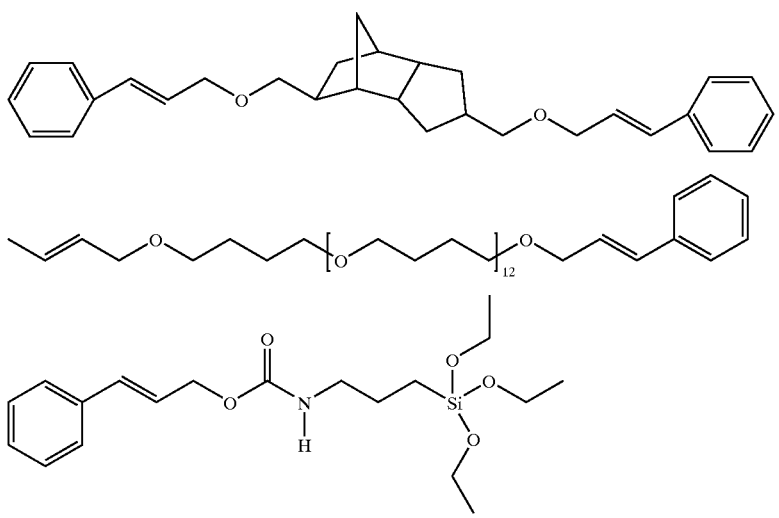

-continued

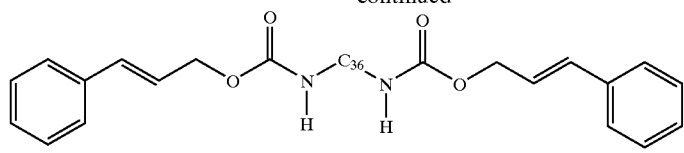

in which $C_{36}$ represents a linear or branched alkyl of 36 carbons derived from linoleic and oleic acids.

Examples of suitable styrenic donors for use with maleimides include:

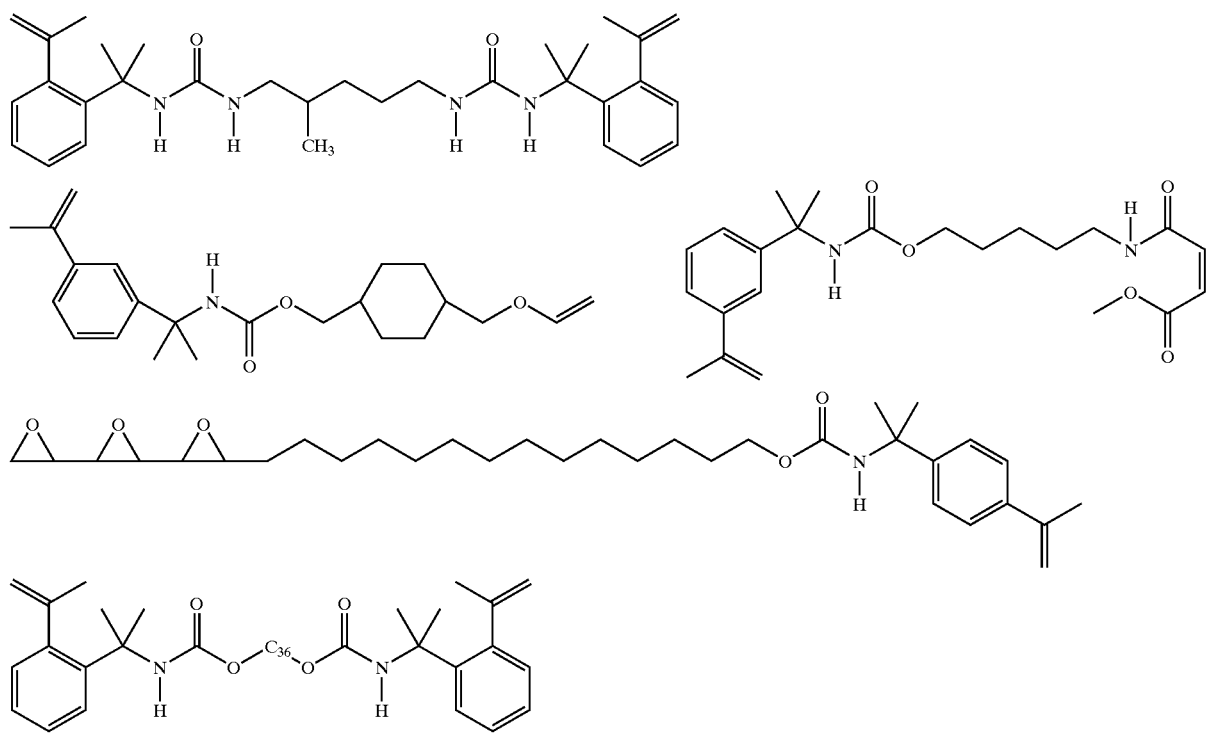

in which $C_{36}$ represents a linear or branched alkyl of 36 carbons derived from linoleic and oleic acids.

The underfill composition may also include a fluxing agent to remove metal oxide from the electrical terminal pads and to prevent reoxidation. A variety of different fluxing materials may be employed, although the preferred fluxing agent will be a carboxylic acid or anhydride. Preferred fluxing agents include polysebasic polyanhydride, rosin gum, dodecanedioic acid (commercially available as Corfree M2 from Aldrich), adipic acid, tartaric acid, and citric acid. Other suitable fluxing agents include alcohols, hydroxyl acids and hydroxyl bases. Preferable fluxing materials include polyols such as ethylene glycol, glyercol, 3-[bis(glycidyl oxy methyl) methoxy]-1,2-propane diol, D-ribose, D-cellobiose, cellulose, and 3-cyclohexene-1,1-dimethanol.

Optionally, solvents can be utilized to modify the viscosity of the composition, and if used should be chosen so that they evaporate during the B-stage heating. Typically, B-stage heating will occur in the range of about 100° C. to about 150° C. Examples of solvents that may be utilized include ketones, esters, alcohols, ethers, and other solvents that are stable and dissolve the composition's components.

Preferred solvents include γ-butyrolactone and propylene glycol methyl ethyl acetate.

Suitable fillers for underfill materials are nonconductive and include particles of vermiculite, mica, wollastonite, calcium carbonate, titania, sand, glass, fused silica, fumed silica, barium sulfate, and halogenated ethylene polymers, such as tetrafluoroethylene, trifluoro-ethylene, vinylidene fluoride, vinyl fluoride, vinylidene chloride, and vinyl chloride. If used, fillers generally will be present in amounts up to 98% by weight of the formulation.

Curing agents such as free radical initiators, thermal initiators, and photoinitiators will be present in an effective amount to cure the composition. In general, those amounts will range from 0.1% to 30%, preferably 1% to 20%, by weight of the total organic material (that is, excluding any inorganic fillers) in the composition. Preferred free-radical initiators include peroxides, such as butyl peroctoates and dicumyl peroxide, commercial products, such as USP90MD (a product of Witco), and azo compounds, such as (VAZO52 and VAZO64 (products of Dupont), 2,2'-azobis(2-methyl-propanenitrile) and 2,2'-azobis(2-methyl-butanenitrile). Preferred photoinitiators are those sold by Ciba Specialty Chemicals under the trademark Irgacure.

For some first compositions, it may be advantageous to include a curing accelerator, such as cobalt neodecanoate, to lower the curing temperature. If added, curing accelerators will be present in an amount from about 0.05% to about 1.0% by weight of the organic components of the first composition, excluding the organic components of the second composition and any fillers. It may in some cases also be advantageous to add a cationic curing agent, such as Rhodorsil 2074.

Other optional ingredients at the disposal of the formulator are defoaming agents, adhesion promoters, wetting agents, flow additives and rheology modifiers, which if added typically will be present in amounts from 0.01% to 5% by weight.

Silicon wafers have an active face, on which the microcircuitry is embedded, and a passive face. The dual cure underfill compositions of this invention are stenciled onto the active face of the silicon wafer. In a further embodiment, this invention is a silicon wafer with an active face containing circuitry on which has been deposited a B-stageable underfill, the B-stageable underfill comprising a first composition with a lower curing temperature as described previously and a second composition with a higher curing temperature as described previously, characterized in that the first composition has been fully cured.

EXAMPLES

Example 1

Two compositions with dual cure capability were prepared and tested to determine the appropriate parameters for B-staging and to demonstrate proper interconnection formation. The components in parts by weight are recorded in Table 1.

TABLE 1

| FORMULATION A (Parts by weight) | |
|---|---|
| Epoxy Epon 1001 | 50 |
| 2-Phenoxyethyl acrylate | 25.2 |
| Butylphenyl maleimide | 25 |
| Cobalt neodecanoate | 1 |
| t-Butyl peroctoate | 2 |
| Adduct of PMDA and 2P4Mz | 2 |
| Dodecanedioic acid | 10 |

| FORMULATION B (Parts by weight) | |
|---|---|
| Epoxy Epon 1001 | 50 |
| 2-Phenoxyethyl acrylate | 25.2 |
| Cobalt neodecanoate | 1 |
| t-Butyl peroctoate | 2 |
| Adduct of PMDA and 2P4Mz | 2 |
| Dodecanedioic acid | 10 |

Achieving proper B-staging parameters is important for both the dicing of the wafer and for the eventual attach of the semiconductor chip to its substrate. If the formulation is heated (B-staged) for less than the optimal time, the underfill will be tacky and will affect the dicing process. If the material is heated (B-staged) at too high a temperature or for too long a time period, the second composition will start to cure. If the second composition starts to cure, the over-B-staged coating on the chip will not flow during attachment of the chip to the substrate, which affects the adhesion of the underfill encapsulant and eventually the performance of the semiconductor package.

The test vehicle used to determine the ability of the compositions to be B-staged and the appropriate parameters for B-staging was a glass slide bumped with eutectic solder balls 20 mil in diameter. Formulations A and B were stenciled independently onto the test vehicles to a height of 20 mil. The test vehicles were heated at 130° C. under vacuum in a NAPCO vacuum oven, model 5831, with vacuum reading at 73.66 cm (29 inch) Hg for 30 minutes and at each 10 minute interval up to 100 minutes.

After each time period of heating, the test vehicles were checked for a non-tacky, uniform, and smooth coating by visual observation and manual touching.

The test vehicles were also investigated for curing of the second composition. After each time period for heating as described above, the test vehicle was placed underfill side down onto a piece of FR-4 Board with copper finish. This assembly was then passed through a reflow oven with a typical reflow temperature profile with the highest temperature at 240° C. The assembly was visually checked through the glass slide for fluxing of the solder balls and attachment between the glass slide test vehicle and the FR-4 board. Enlarged solder balls are indicative of fluxing. The absence of fluxing is indicative of curing of the second composition, which would constrain the solder and inhibit it from flowing. The absence of fluxing also prevents the attachment of the test vehicle to the FR-4 board.

The results of the test are reported in Table 2 and show that for these formulations, B-staging can achieve a non-tacky coating and no curing of the second composition.

TABLE 2

B-staging Times and Results

| 130° C. for time (min) | Tacky | Second Composition Cured |
|---|---|---|
| 30 | Yes | No |
| 40 | Yes | No |
| 50 | No | No |
| 60 | No | No |
| 70 | No | Yes |
| 80 | No | Yes |
| 90 | No | Yes |
| 100 | No | Yes |

Visual observation and the data show that show that the optimal B-staging time under is 50–60 minutes at 130° C. in the vacuum oven for the compositions with thickness of 20 mils. Under these B-stage conditions, a smooth, non-tacky, and void-free coating formed on the glass slide. If the material was cured less than this time, the underfill was still tacky. If the material was B-staged longer than 60 minutes, after the glass slide was attached on the FR-4 board, the assembly showed either no-flux of the solder balls, or poor attachment between the parts, or both.

It should be pointed out that the optimal B-stage period depends on the thickness of the underfill encapsulant and the chemical composition of the formulations. In general, the thicker the underfill encapsulant, the longer the required B-stage time period. Determination of the optimal B-stage time is within the expertise of one skilled in the art with the disclosures of this specification.

Example 2

This example demonstrates the ability of the dual curable underfill compositions to flux eutectic Pb/Sn solder and enable the formation of interconnection with the substrate. The same Formulations A and B used in Example 1 were used here. Eutectic solder balls 20 mils in diameter were placed onto a glass slide. The underfill material was coated onto the glass slides to a thickness of around 20 mils by stenciling. The glass slides were then placed on a hot-plate, preheated at 135° C., and held at that temperature for 50 minutes. A smooth, void free, non-tacky coating was obtained.

The coated glass slide was then placed (coated side down) on a piece of copper finished FR-4 substrate. The FR-4 substrate (with the coated glass slide on its top) was placed on a hot-plate that was pre-heated to 240° C. It was observed that the solder balls increased in area and the slide collapsed onto the substrate, indicating that the solder fluxed and an interconnection between chip and substrate would have been formed. The underfill also wetted the substrate and flowed to form a complete fillet around the glass slide.

Using exactly the same underfill compositions and processes, similar results were obtained on OSP (Organic Solderable Passivation) coated copper substrate.

What is claimed:

1. A silicon wafer having a B-stageable underfill material deposited on one face of the wafer, the B-stageable underfill comprising a combination of two chemical compositions, a first composition, selected from the group consisting of acrylic compounds; cycloaliphatic epoxy compounds; bismaleimide compounds; and bismaleimide compounds in combination with vinyl ether, vinyl silane, styrenic or cinnamyl compounds; which has been cured at a temperature within the range of 100° C. to 150° C., and a second composition that is an uncured epoxy compound and a complex of 1 part 1,2,4,5-benzenetetracarboxylic anhydride and 4 parts 2-phenyl-4-methylimidazole, or an uncured epoxy compound and a complex of 1 part 1,2,4,5-benzenetetracarboxylic dianhydride and 2 parts 2-phenyl-4-methylimidazole, the first composition, before cure, being a liquid, or a solid dissolved or dispersed in a solvent;

the second composition, before and after cure of the first composition, being a solid or semi-solid material at room temperature, dispersible or dissolvable either in the first composition if the first composition before cure was a liquid, or in the solvent for the first composition if the first composition before cure was a solid dissolved or dispersed in a solvent;

the curing temperatures of the first and second compositions being separated by at least 30° C. to allow the first composition to cure without curing the second composition.

2. A B-stageable underfill composition comprising a combination of two chemical compositions, a first composition that is a liquid, or a solid dissolved or dispersed in a solvent, curable at a temperature within the range of 100° C. to 150° C., and that is selected from the group consisting of acrylic compounds; cycloaliphatic epoxy compounds; bismaleimide compounds; and bismaleimide compounds in combination with vinyl ether, vinyl silane, styrenic or cinnamyl compounds; and a second composition that is a solid or semi-solid at room temperature, dispersible or dissolvable either in the first composition if the first composition is a liquid, or in the solvent for the first composition if the first composition is a solid dissolved or dispersed in a solvent, and that is an epoxy compound and a complex of 1 part 1,2,4, 5-benzenetetracarboxylic anhydride and 4 parts 2-phenyl-4-methylimidazole, or an epoxy compound and a complex of 1 part 1,2,4,5-benzenetetracarboxylic dianhydride and 2 parts 2-phenyl-4-methylimidazole.

the second composition having a curing temperature or curing temperature range higher than the curing temperature or curing temperature range of the first composition, the curing temperatures or curing temperature ranges sufficiently separated to allow the first composition to cure without curing the second composition.

* * * * *